(12) United States Patent
Dubin

(10) Patent No.: US 7,300,860 B2
(45) Date of Patent: Nov. 27, 2007

(54) INTEGRATED CIRCUIT WITH METAL LAYER HAVING CARBON NANOTUBES AND METHODS OF MAKING SAME

(75) Inventor: Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 242 days.

(21) Appl. No.: 10/814,375

(22) Filed: Mar. 30, 2004

(65) Prior Publication Data

US 2005/0218523 A1    Oct. 6, 2005

(51) Int. Cl.
- *H01L 21/20* (2006.01)
- *H01L 21/44* (2006.01)
- *H01L 23/48* (2006.01)

(52) U.S. Cl. ............ 438/584; 438/674; 257/774; 257/E23.165; 977/847; 977/857; 977/936

(58) Field of Classification Search ........... 977/847, 977/936, 778, 784, 892, 893, 899, 938; 438/584, 438/674, 687; 257/23.165
See application file for complete search history.

(56) References Cited

U.S. PATENT DOCUMENTS

| | | | |
|---|---|---|---|
| 5,674,787 A | 10/1997 | Zhao et al. | |
| 5,695,810 A | 12/1997 | Dubin et al. | |
| 5,824,599 A | 10/1998 | Schacham-Diamand et al. | |
| 5,830,805 A | 11/1998 | Shacham-Diamand et al. | |
| 5,833,820 A | 11/1998 | Dubin | |
| 5,882,498 A | 3/1999 | Dubin et al. | |
| 5,891,513 A | 4/1999 | Dubin et al. | |
| 5,895,562 A | 4/1999 | Dubin | |
| 5,913,147 A | 6/1999 | Dubin et al. | |
| 5,968,333 A | 10/1999 | Nogami et al. | |
| 5,969,422 A | 10/1999 | Ting et al. | |
| 5,972,192 A | 10/1999 | Dubin et al. | |
| 6,001,415 A | 12/1999 | Nogami et al. | |
| 6,065,424 A | 5/2000 | Shacham-Diamand et al. | |
| 6,077,780 A | 6/2000 | Dubin | |
| 6,106,680 A | 8/2000 | Nogami et al. | |
| 6,162,726 A | 12/2000 | Dubin | |
| 6,249,055 B1 | 6/2001 | Dubin | |
| 6,271,591 B1 | 8/2001 | Dubin et al. | |
| 6,359,328 B1 | 3/2002 | Dubin | |
| 6,362,100 B1 | 3/2002 | Nogami et al. | |
| 6,432,821 B1 | 8/2002 | Dubin et al. | |
| 6,491,806 B1 | 12/2002 | Dubin et al. | |
| 6,518,184 B1 | 2/2003 | Chambers et al. | |
| 6,645,567 B2 | 11/2003 | Chebiam et al. | |
| 6,677,233 B2 | 1/2004 | Dubin | |
| 6,696,758 B2 | 2/2004 | Dubin et al. | |
| 6,733,679 B2 | 5/2004 | Dubin et al. | |
| 6,975,063 B2 * | 12/2005 | Mao et al. | 313/309 |
| 7,120,047 B2 * | 10/2006 | Segal et al. | 365/151 |
| 2002/0036145 A1 | 3/2002 | Dubin et al. | |
| 2002/0064592 A1 | 5/2002 | Datta et al. | |
| 2002/0074234 A1 | 6/2002 | Dubin et al. | |
| 2002/0084529 A1 | 7/2002 | Dubin et al. | |
| 2002/0094673 A1 | 7/2002 | Dubin | |

(Continued)

*Primary Examiner*—Nitin Parekh
(74) *Attorney, Agent, or Firm*—Schwabe, Williamson & Wyatt, P.C.

(57) ABSTRACT

A method of fabricating an integrated circuit comprises forming or providing a solution containing carbon nanotubes and forming a metal layer utilizing the solution.

17 Claims, 6 Drawing Sheets

U.S. PATENT DOCUMENTS

| | | |
|---|---|---|
| 2003/0071355 A1 | 4/2003 | Dubin et al. |
| 2003/0085177 A1 | 5/2003 | Dubin et al. |
| 2003/0102222 A1* | 6/2003 | Zhou et al. .................. 205/109 |
| 2003/0113576 A1 | 6/2003 | Dubin et al. |
| 2003/0124840 A1 | 7/2003 | Dubin |
| 2003/0134047 A1 | 7/2003 | Dubin et al. |
| 2003/0137050 A1 | 7/2003 | Chambers et al. |
| 2003/0207560 A1 | 11/2003 | Dubin et al. |
| 2003/0207561 A1 | 11/2003 | Dubin et al. |
| 2004/0000720 A1 | 1/2004 | Dubin et al. |
| 2004/0035316 A1 | 2/2004 | Chebiam et al. |
| 2004/0038073 A1 | 2/2004 | Chebiam et al. |
| 2004/0048437 A1 | 3/2004 | Dubin |
| 2004/0053441 A1 | 3/2004 | Dubin et al. |
| 2004/0058139 A1 | 3/2004 | Dubin et al. |
| 2004/0084773 A1 | 5/2004 | Johnston et al. |
| 2004/0096592 A1 | 5/2004 | Chebiam et al. |
| 2004/0108217 A1 | 6/2004 | Dubin |
| 2004/0150100 A1 | 8/2004 | Dubin et al. |
| 2006/0211236 A1* | 9/2006 | Bureau et al. ............... 438/628 |

* cited by examiner

INTEGRATED CIRCUIT WITH METAL LAYER HAVING CARBON NANOTUBES AND METHODS OF MAKING SAME

FIELD OF THE INVENTION

The present invention relates in general to the field of integrated circuits and, in particular, to their fabrication.

BACKGROUND OF INVENTION

Metal layers in integrate circuits are utilized to electrically interconnect various devices fabricated on a substrate. Resistance of the materials utilized in the metal layers affect the speed with which signals can propagate between these devices. To improve the propagation of signals, copper has taken over as the primary metal in use in high speed design applications.

Nevertheless, even with increase conductivity of copper, vis-á-vis aluminum, speed issues with copper interconnect exist. For example, as copper conductor features continue to decrease in size, the conductivity resistance associated with the copper conductors increases causing a decrease in speed of signals on these size decreased signal traces. Another problem that affects the propagation of signals is an increase in the electromigration resistance. As conductor feature sizes continue to decrease copper electromigration resistance is limited by such things as surface diffusion and voids.

BRIEF DESCRIPTION OF DRAWINGS

Embodiments of the present invention will be described referencing the accompanying drawings in which like references denote similar elements, and in which.

DETAILED DESCRIPTION OF THE EMBODIMENTS

Various aspects of illustrative embodiments of the invention will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials, and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise.

Carbon nanotubes, depending on their configuration, may exhibit various electrical properties. For example, in one configuration, carbon nanotubes may act as semiconductors. In another configuration, carbon nanotubes act as conductors. Specifically, single wall carbon nanotubes in an arm chair configuration exhibit a number of metallic characteristics.

Among these metallic characteristics, a number of properties are of particular interest with respect to their possible use as part of a metal layer. Single wall, arm chair carbon nanotubes have been shown to have high electrical and thermal conductivity, e.g. higher than copper. Composite single wall carbon nanotube and copper material have also been shown to have higher electrical conductivity than copper. In addition, single wall carbon nanotubes have high electromigration resistance. Composite single wall carbon nanotube and copper materials have also been shown to have higher electromigration resistance than copper.

Disclosed herein are methods of fabricating integrated circuit having conduction layer with potentially higher electrical and thermal conductivity and/or higher electromigration resistance than the prior art. These methods include electro- and electroless plating of metals, electrophoresis and spin on. While the discussion below is focused around the metallization in a dual damascene process, it will be appreciated that the disclosed method can be utilized to provide conductive material application in other integrated circuit processes.

Figure 1:
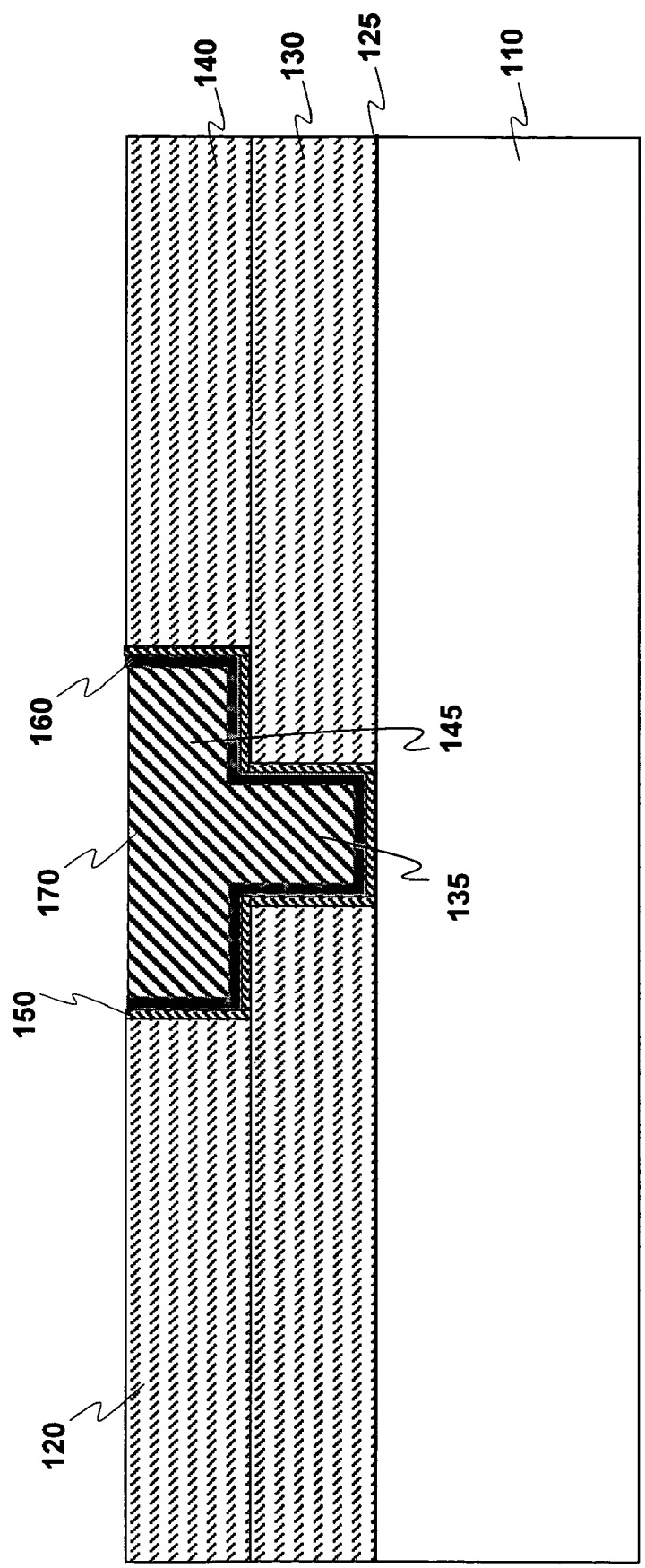
FIG. 1 illustrates a cross sectional view of a portion of an integrated circuit having a dial damascene features.

FIG. 1 illustrates a cross sectional view of a portion of an integrated circuit having a dual damascene feature, in accordance with one embodiment. The integrated circuit includes a substrate 110. Active components of a circuit are formed on substrate 110. Further, one or more layers of metal are formed to provide for interconnect between the active components. An oxide layer 120 is fabricated on an etch stop layer 125. The oxide layer 120 comprises two layers; one used as a via layer 130 and one as a trench layer 140. One of several methods may be utilized to create the trenches 145 and vias 135. In the via-first method, both layers 130 140 may be etched creating vias 135. Next, the trench layer 140 only may be etched creating trenches 145 for the layer of interconnect. A barrier layer 150 may be placed on the oxide to separate the metallization layer from the oxide layer to prevent interaction between the two layers. A seed layer 160 is then placed on the barrier layer 150. A metal layer 170 is then placed on the seed layer 160. As discussed in more detail below, the metal layer 170 comprises carbon nanotubes. For each of the above processes, a chemical mechanical process may be utilized to planarize the surface of the particular layer.

Figure 2:
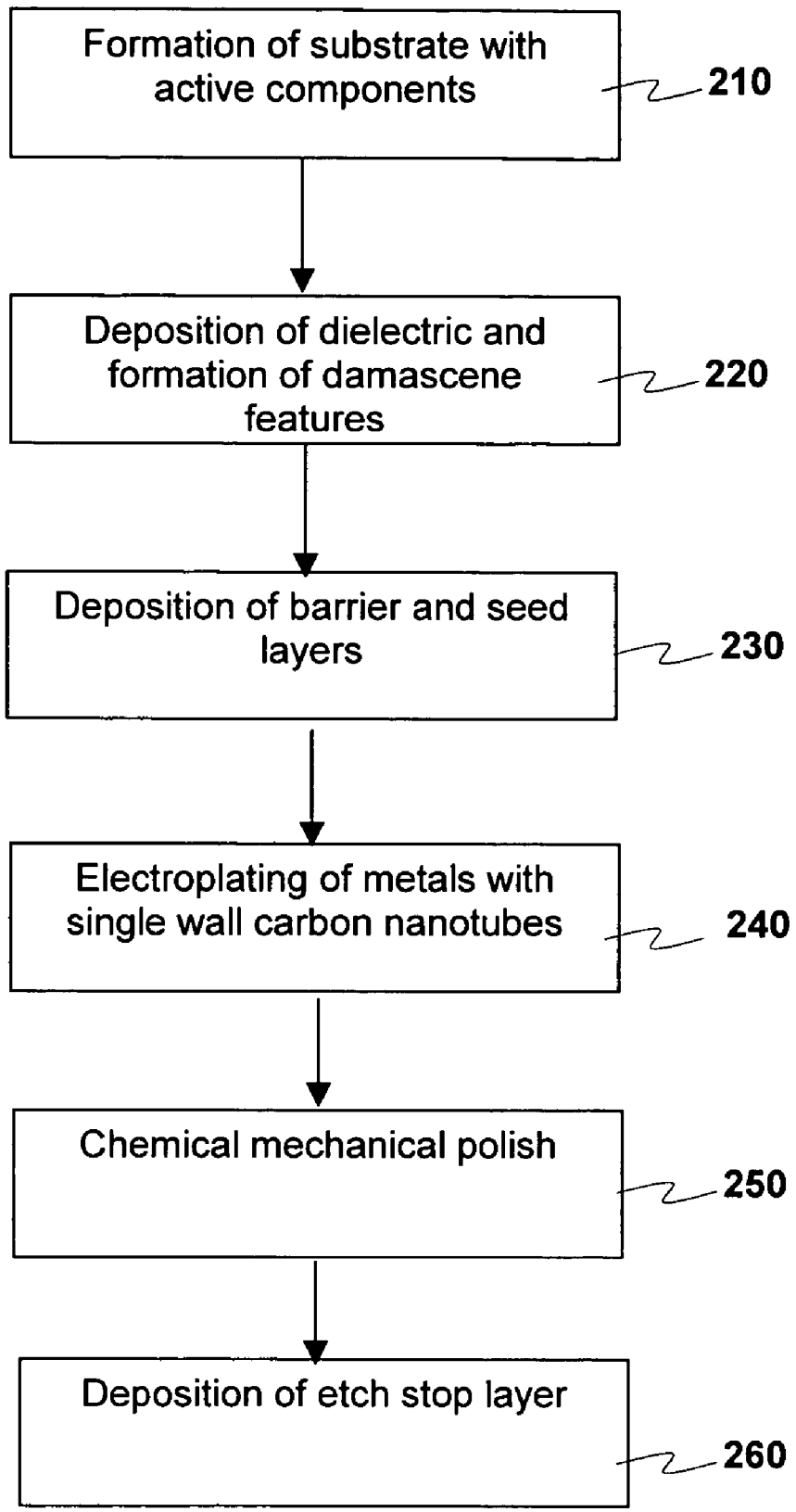
FIG. 2 shows a flowchart illustrating a method for creating portions of an integrated circuit design, in accordance with one embodiment.

FIG. 2 shows a flowchart illustrating a method for creating portions of an integrated circuit design, in accordance with one embodiment. Illustrated is a method for forming an interconnect utilizing co-electroplating to form a metal layer with carbon nanotubes. As illustrated, a substrate with active components is first formed 210. Next, deposition of a dielectric layer, to facilitate formation of interconnects to interconnect the active components, is performed. Further, formation of dual damascene features in the dielectric layer, by using e.g. operations of lithography and etching, is performed 220.

Next, a barrier layer and a seed layer are deposited 230. The barrier layer may comprise a material such as tantalum, tantalum nitride, tantalum silicon nitride, titanium nitride, titanium silicon nitride, tungsten nitride, tungsten silicon nitride, cobalt tungsten phosphide or other materials of the like. The barrier layer may be deposited by physical vapor deposition (PVD), chemical vapor deposition (CVD), atomic layer deposition (ALD) or plating. In various embodiments, the seed layer is deposited on the barrier layer. This seed layer may comprise a material such as copper or its alloys. Examples of these include CuAl, CuSn, CuIn, CuCd or other materials of the like. The seed layer may be deposited utilizing PVD, CVD or plating.

Next, metals containing carbon nanotubes are electroplated to the seed layer 240. In various embodiments, the carbon nanotubes are single wall, arm chair carbon nanotubes, and the electroplating process is a Co-electroplating process. In various embodiments, the electroplating is performed utilizing solutions containing metal ions such as Cu, Ag, Au, Al, Sn, In, Ni, Co, Fe, Cd, Cr, Ru, Rh, Re, Sb, Bi, Pt, Zn, Pd, Mn, Ir, Os, Mo, W, their alloys or other materials of the like. The solution may also contain one or more support electrolyte such as sulfuric acid, sulfonic acid, potassium hydroxide and the like. In particular, the solution further contains (single wall, arm chair) carbon nanotubes suspensions. Carbon nanotubes may be suspended in solvents such as water, ethanol, methanol, ethyleneglycol, and so forth. Suspension can be effectuated by e.g. sonication.

Carbon nanotubes can be also made soluble by their functionalization. For example, the carbon nanotubes may be treated with $H_2SO_4$ or $HNO_3$ to create a COOH functional group. This may be followed by treatment with $S(O)Cl_2/H_2N$—R—SH to create a C(O)N(H)—R—SH functional group. This may be further treated with a reducing agent such as $H_2PtCl_6$ to create carbon nanotubes covered with platinum particles. In an alternative embodiment, the solution additionally comprises complexing agents such as ethylenediaminetetra-acetic acid (EDTA), tartrate, citric acid or other materials of the like. Suitable (single wall, arm chair) carbon nanotube suspensions include, but are not limited to, those available from various vendors such as Carbon Nanotechnologies Inc., of Houston Tex.

After the metal layer is fabricated, chemical mechanical polish (CMP) or electropolish may be utilized to remove excess materials 250. Further, a passivation or stop etch layer may be optionally deposited on top of the metallization layer 260. In one embodiment, the passivation/etch stop layer may comprise SiN, SiC, electroless cobalt, or other materials of the like.

As needed, the procedures 220-260 may be repeated to add additional interconnects.

Figure 3:
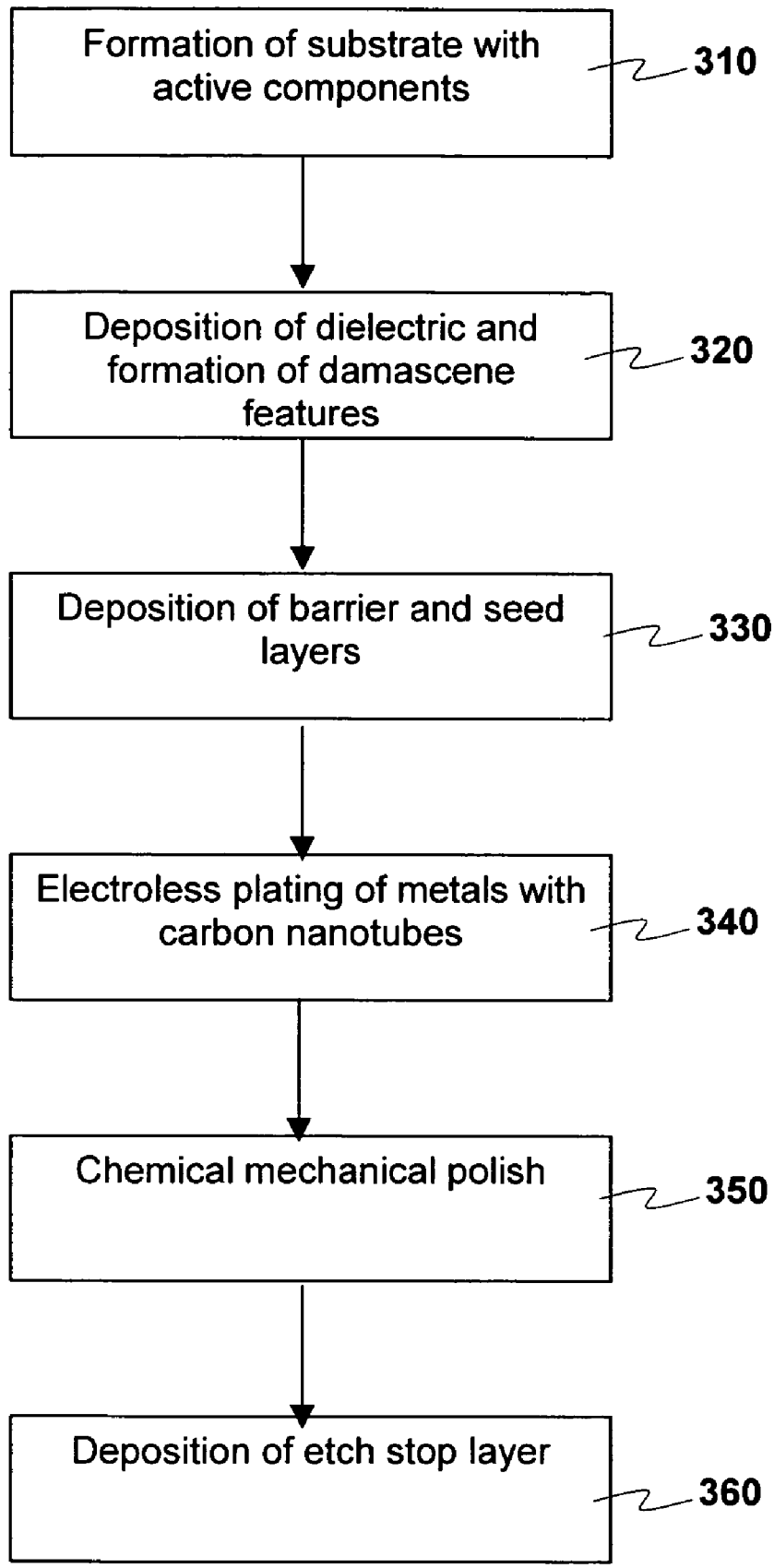
FIG. 3 shows a flowchart illustrating a method for creating portions of an integrated circuit design, in accordance with another embodiment.

FIG. 3 shows a flowchart illustrating a method for creating portions of an integrated circuit design, in accordance with another embodiment. Illustrated is a method for forming an interconnect utilizing electroless plating to deposit a metal layer with carbon nanotubes. As previously, a substrate with active components is formed 310. The substrate may then be planerized utilized CMP. Then, deposition of a dielectric layer to facilitate formation of interconnects to interconnect the active components may be performed. Further, dual damascene features may be formed in the dielectric layer by using e.g. operations of lithography and etching 320.

As with the previous embodiment, barrier and seed layers may then be deposited 330. The barrier layer may comprise a material such as tantalum, tantalum nitride, tantalum silicon nitride, titanium nitride, titanium silicon nitride, tungsten nitride, tungsten silicon nitride, cobalt tungsten phosphide, or other materials of the like. The barrier layer may be deposited by physical vapor deposition (PVD), chemical vapor deposition (CVD), atomic layer deposition (ALD) or plating.

The seed layer is deposited on the barrier layer. The seed layer may comprise a material made of catalytic material for electroless deposition. Examples of these include copper, cobalt, nickel, gold, platinum, rhodium, ruthenium, silver, palladium, iron, and the like. The seed layer may be deposited utilizing PVD, CVD or plating.

Metals containing carbon nanotubes are electrolessly plated to the seed layer to produce an interconnect layer 340. In various embodiments, the carbon nanotubes comprise single wall, arm chair carbon nanotubes, and the electroless plating process comprises a co-electroless plating process. The electroless plating is performed utilizing solutions containing metal ions such as Cu, Ag, Au, Al, Sn, In, Ni, Co, Fe, Cd, Cr, Ru, Rh, Re, Sb, Bi, Pt, Zn, Pd, Mn, Ir, Os, Mo, W, their alloys and the like. The solution may also contain reducing agents, complexing agents and carbon nanotubes suspensions. As discussed previously, various techniques may be utilized to produce the carbon nanotubes suspensions. Reducing agents may comprise compounds such as hyphophosphite, amino-borane, formaldehyde, glyoxylic acid, hydrazine, redox pairs such as $Ti3+/Ti4+$, $Fe2+/Fe3+$, or other materials of the like. Complexing agents may comprise compounds such as EDTA, tartrate, citric acid, or other materials of the like.

As previously stated, after the metal layer has been laid down, chemical mechanical polish (CMP) or electropolish may be utilized to remove excess materials 350. Deposition of a passivation/etch stop layer may be optionally made on top of the metal layer 360. The passivation/etch stop layer may comprise SiN, SiC, electroless cobalt, or other materials of the like. As needed, the procedures discussed above may be repeated to add additional interconnects.

Figure 4:
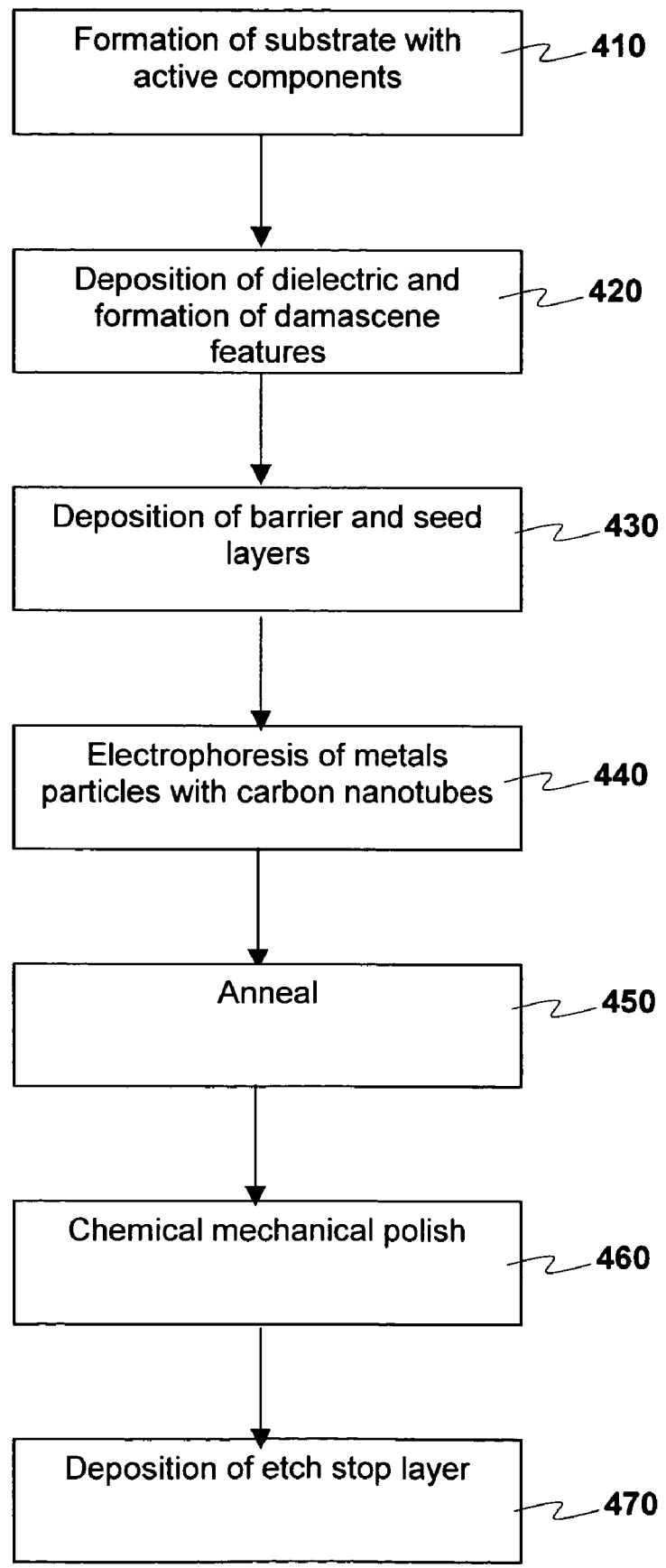
FIG. 4 shows a flowchart illustrating a method for creating portions of an integrated circuit design, in accordance with yet another embodiment.

FIG. 4 shows a flowchart illustrating a method for creating portions of an integrated circuit design, in accordance with yet another embodiment. Illustrated is a method for forming an interconnect utilizing electrophoresis to deposit a metal layer with carbon nanotubes. As with the previous embodiments, a substrate with active components is formed 410. Deposition of a dielectric layer to facilitate formation of interconnects to interconnect the active components is performed. Further, dual damascene features are formed in the dielectric layer by using e.g. operations of lithography and etching 420.

As with the previous embodiments, a barrier layer and seed layer are deposited 430. The barrier layer may comprise a material such as tantalum, tantalum nitride, tantalum silicon nitride, titanium nitride, titanium silicon nitride, tungsten nitride, tungsten silicon nitride, cobalt tungsten phosphide or other materials of the like. The barrier layer may be deposited by physical vapor deposition (PVD), chemical vapor deposition (CVD), atomic layer deposition (ALD) or plating.

The seed layer is deposited on the barrier layer. Examples of seed materials include copper, cobalt, nickel, gold, platinum, rhodium, ruthenium, silver, palladium, iron and the like. The seed layer may be deposited utilizing PVD, CVD or plating.

Next, electrophoresis of metal particles utilizing solutions comprising metals particles such as Cu, Ag, Au, Al, Sn, In, Ni, Co, Fe, Cd, Cr, Ru, Rh, Re, Sb, Bi, Pt, Zn, Pd, Mn, Ir, Os, Mo, W, their allows or other materials of the like, including carbon nanotubes, is performed 440. In various embodiments, the metal particles are 10 to 50 nanometers. In various embodiments, carbon nanotubes are single wall, arm chair carbon nanotubes. The solution may also comprise ligands making the metal particles and the carbon nanotubes charged. The solution may further comprise support electrolyte such as H2O, ethyleneglycol or other materials of the like. An example of such suitable solutions include, but are not limited to, those provided by ALD Nanosolutions, Inc.

After the electrophoresis of the metal particles containing carbon nanotubes, an annealing process may be applied 450. This process is performed to melt the metal particles containing the carbon nanotubes. The process may be performed at a range of temperatures (e.g. 200 to 500 degree C.) for a period from 1 to 200 minutes.

As with the previous embodiments, a CMP or electropolish may be performed to remove excess material 460. A passiviation/etch stop layer may optionally be deposited on top of the metal layer 470. The above process may be repeated for additional interconnects.

Figure 5:
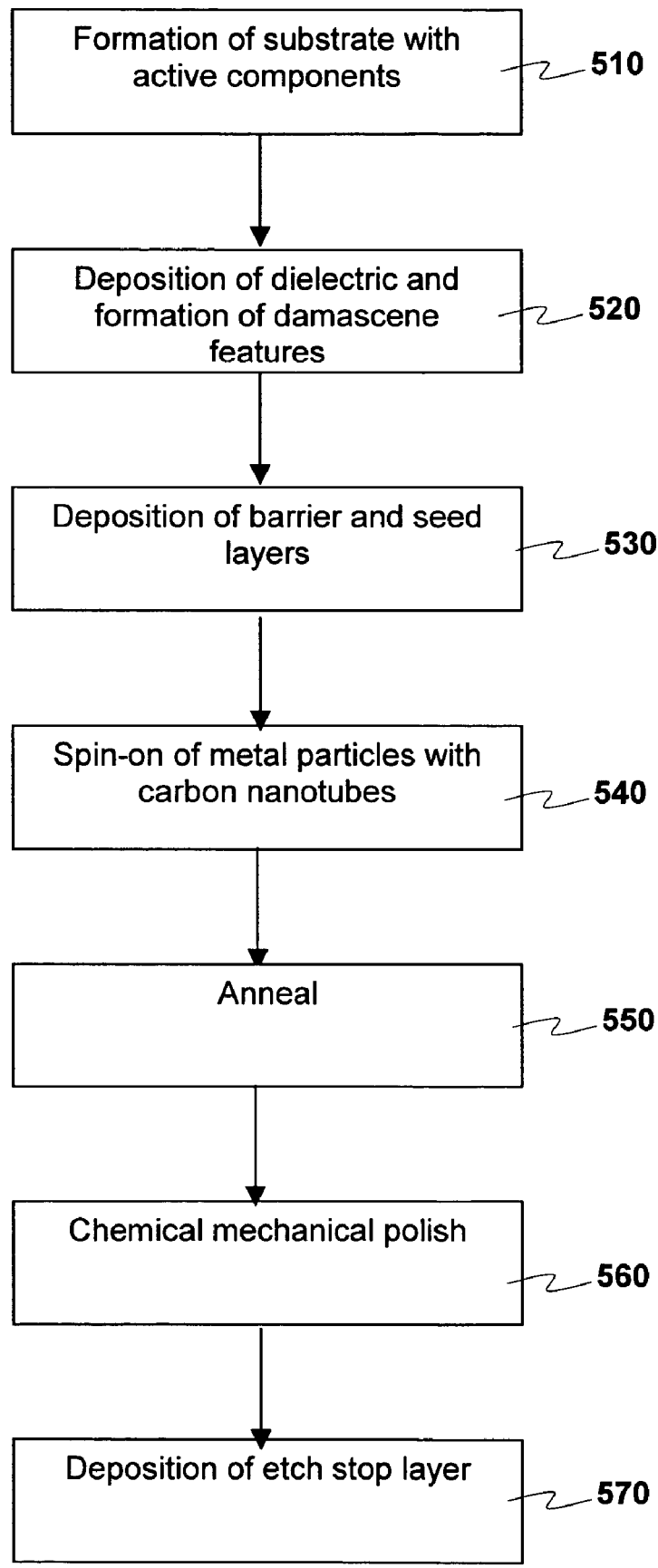
FIG. 5 shows a flowchart illustrating a method for creating portions of an integrated circuit design, in accordance with another embodiment.

FIG. 5 shows a flowchart illustrating a method for creating portions of an integrated circuit design, in accordance with another embodiment. Illustrated is a method for forming an interconnect, utilizing spin-on to deposit a metal layer with carbon nanotubes. As with the previous embodiments, a substrate with active components is formed 510. Deposition of a dielectric layer to facilitate formation of interconnects to interconnect the active components may be performed. Further, dual damascene features are formed in the dielectric layer by using e.g. operations of lithography and etching 520.

As with the previous embodiments, a barrier layer and a seed layer are deposited 530. The barrier layer may comprise a material such as tantalum, tantalum nitride, tantalum silicon nitride, titanium nitride, titanium silicon nitride, tungsten nitride, tungsten silicon nitride, cobalt tungsten phosphide or other materials of the like. The barrier layer may be deposited by physical vapor deposition (PVD), chemical vapor deposition (CVD), atomic layer deposition (ALD) or plating.

Similarly, as with several previous embodiments, the seed layer is deposited on the barrier layer. The seed layer may comprise a material made of catalytic material for electroless deposition. Examples of these include copper, cobalt, nickel, gold, platinum, rhodium, ruthenium, silver, palladium, iron and the like. The seed layer may be deposited utilizing PVD, CVD or plating.

Spin on of metal particles utilizing solutions comprising metals particles such as Cu, Ag, Au, Al, Sn, In, Ni, Co, Fe, Cd, Cr, Ru, Rh, Re, Sb, Bi, Pt, Zn, Pd, Mn, Ir, Os, Mo, W, their alloys or other materials of the like, including carbon nanotubes, is performed 540. In various embodiments, the metal particles are 10 to 50 nanometers in size. In various embodiments, the carbon nanotubes are single wall, arm chair carbon nanotubes. In various embodiments, spin on may be performed at substrate rotation speed of about 20-100 rpm for about 1-5 min at room temperature. An example of such suitable solutions include, but are not limited to, those provided by NSI Corp. The solution may also comprise ligands and carbon nanotubes charged. The solution may further comprise support electrolyte such as H2O, ethyleneglycol or other materials of the like.

After the spin-on of the metal particles containing carbon nanotubes, an annealing process may be applied 550. This process is performed to melt the metal particles containing the carbon nanotubes. The process may be performed at a range of temperatures (e.g. 200 to 500 degree C.) for a period from 1 to 200 minutes.

As with the previous embodiments, a CMP or electropolish may be performed to remove excess materials 560. A passiviation/etch stop layer may be optionally deposited on top of the interconnect lines 570. The above process may be repeated for additional interconnects.

Discussed above are methods of fabricating materials which has the potential of exhibiting high electrical and thermal conductivity and/or high electromigration resistance. The resulting metal structures containing (single wall, arm chair) carbon nanotubes dispersed therein to contribute to the increase of, among other things, electrical conductivity.

Figure 6:
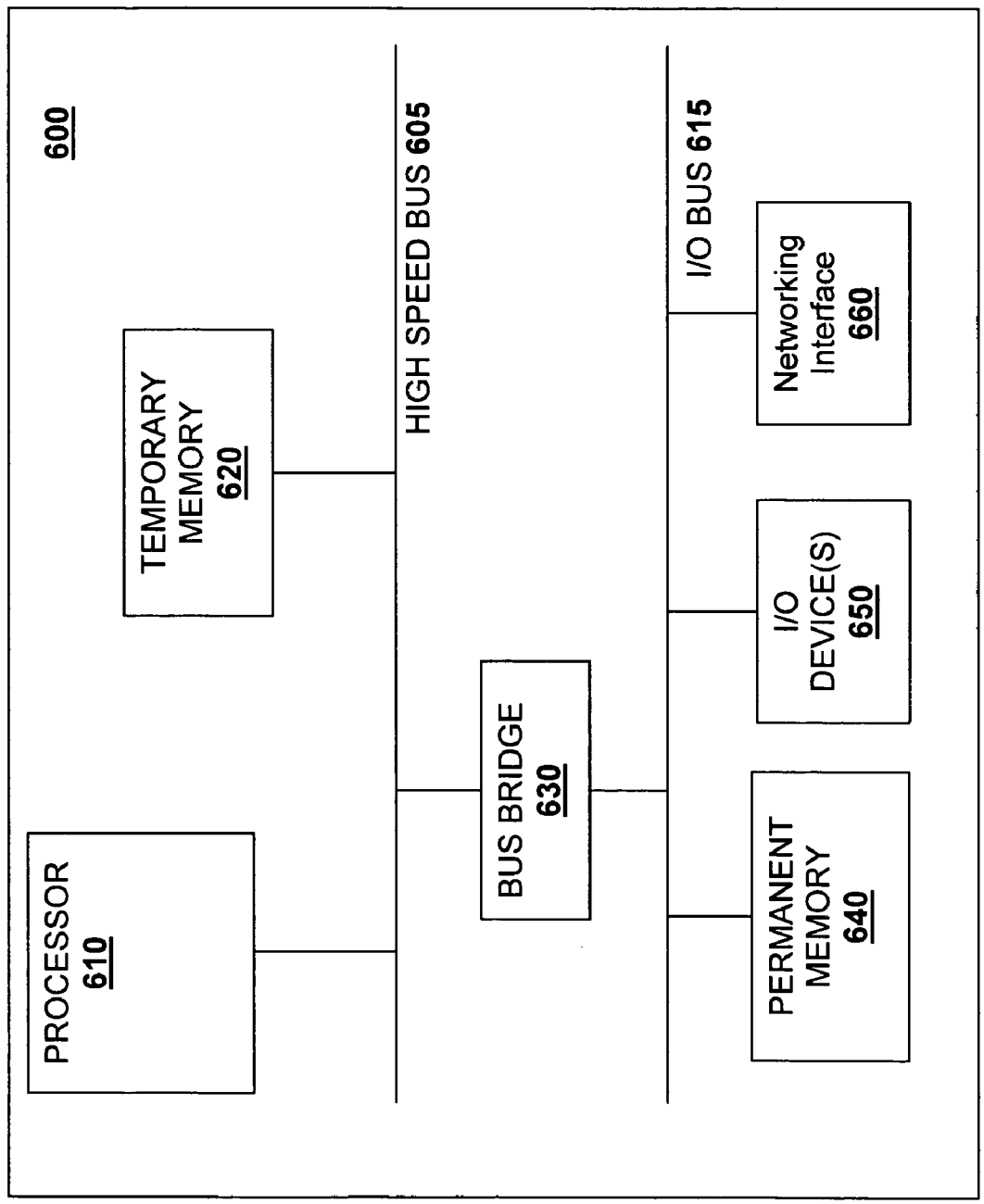
FIG. 6 illustrates is a block diagram of a system including a component formed employing one of the processes of FIG. 2-5, in accordance with one embodiment.

FIG. 6 illustrates is a block diagram of a system 600 including at least one component with metal layers containing carbon nanotubes. As shown, the system 600 includes a processor 610 and temporary memory 620, such as SDRAM and DRAM, on high-speed bus 605. High-speed bus is connected through bus bridge 630 to input/output (I/O) bus 615. I/O bus 615 connects permanent memory 640, such as flash devices and fixed disk device, networking interface 660 and I/O devices 650 to each other and bus bridge 630.

At least one of the components, e.g. processor 610, temporary memory 620, and so forth, is formed having e.g. interconnect, with metal layers having carbon nanotubes. More over, in various embodiments, the carbon nanotubes are single wall, arm chair, carbon nanotubes. In various embodiments, the metal layers with the carbon nanotubes are formed using one of the earlier described processes.

In various embodiments, system 600 may be a hand held computing device, a mobile phone, a digital camera, a tablet computer, a laptop computer, a desktop computer, a set-top box, a CD player, a DVD player, or a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of fabricating an integrated circuit comprising:
   forming or providing a solution containing metal ions and carbon nanotubes; and
   co-depositing the metal ions and carbon nanotubes onto a substrate utilizing the solution to form a metal layer, said co-depositing including spin-coating onto the substrate at a rotation speed of between about 20 and about 100 rpm for a time of between about 1 and about 5 minutes and annealing the substrate at a temperature of between about 200 and about 500° C. for a time of between about 1 and about 200 minutes.

2. The method of claim 1 wherein the solution comprises a carbon nanotube suspension.

3. The method of claim 2 wherein the carbon nanotube suspension comprises single wall, arm chair carbon nanotubes.

4. The method of claim 2 wherein the solution further comprises a support electrolyte.

5. The method of claim 2 wherein the carbon nanotube suspension comprises:
   a plurality of single-walled, arm chair carbon nanotubes; and
   a solvent selected from the group consisting of water, ethanol, methanol and ethylene glycol.

6. The method of claim 1 wherein the metal ions comprise one or more metal ions selected from the group consisting of copper, silver, gold, aluminum, tin, indium, nickel, cobalt, iron, cadmium, chromium, ruthenium, rhodium, rhenium, antimony, bismuth, platinum, zinc, palladium, manganese, iridium, osmium, molybdenum, tungsten and alloys of the afore-enumerated metals.

7. The method of claim 1 comprising removing excess materials.

8. The method of claim 1 comprising depositing a passivation layer on the metal layer.

9. The method of claim 8 wherein the passivation layer comprises one or more passivation materials selected from a group consisting of SiN, SiC, and cobalt.

10. The method of claim 9, wherein the passivation layer comprises cobalt, and wherein said depositing the passivation layer comprises electrolessly plating cobalt on the metal layer.

11. The method of claim 1, further comprising, prior to said co-depositing:
   forming an etch stop layer on the substrate;
   forming an oxide layer on the etch stop layer;
   forming an opening in the oxide layer; and
   forming a barrier layer on the oxide layer in the opening;
   and wherein said co-depositing the metal ions and the carbon nanotubes onto the substrate comprises co-depositing the metal ions and the carbon nanotubes in the opening.

12. The method of claim 11, wherein said forming the opening in the oxide layer comprises forming a via.

13. The method of claim 12, wherein said forming the opening further comprises forming a trench.

14. The method of claim 11, further comprising forming a seed layer on the barrier layer.

15. The method of claim 11, wherein the barrier layer comprises a material selected from a group consisting of tantalum, tantalum nitride, tantalum silicon nitride, titanium nitride, titanium silicon nitride, tungsten nitride, tungsten silicon nitride, and cobalt tungsten phosphide.

16. The method of claim 1, wherein said forming or providing the solution containing metal ions and carbon nanotubes comprises forming or providing a solution containing metal ions and solubilized carbon nanotubes.

17. The method of claim 1, wherein said forming or providing the solution containing metal ions and carbon nanotubes comprises forming or providing a solution containing metal particles having a diameter in a range of about 10 nanometers to about 50 nanometers.

* * * * *